Figure 1:
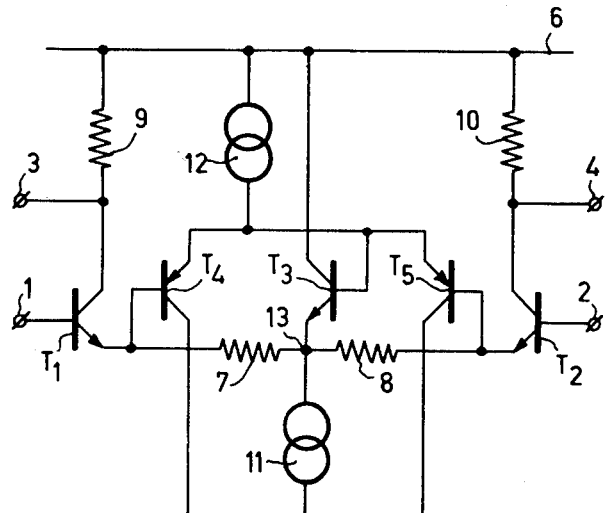

United States Patent [19]

van de Plassche

[11] 4,002,993
[45] Jan. 11, 1977

[54] DIFFERENTIAL AMPLIFIER

[75] Inventor: Rudy Johan van de Plassche, Eindhoven, Netherlands

[73] Assignee: U.S. Philips Corporation, New York, N.Y.

[22] Filed: June 25, 1975

[21] Appl. No.: 590,139

[30] Foreign Application Priority Data

July 8, 1974 Netherlands ............... 7409191

[52] U.S. Cl. .............................. 330/30 D; 330/22; 330/69
[51] Int. Cl.² ........................................... H03F 3/68
[58] Field of Search ................ 330/22, 30 D, 69

[56] References Cited
UNITED STATES PATENTS 3,538,449 11/1970 Solomon ................. 330/30 D
3,764,826 10/1973 Okada ................. 330/30 D X

*Primary Examiner*—Robert Segal
*Assistant Examiner*—Lawrence J. Dahl
*Attorney, Agent, or Firm*—Frank R. Trifari; Bernard Franzblau

[57] ABSTRACT

A differential amplifier with two input transistors whose emitters are each connected to the emitter of a third transistor via a resistor. With the aid of a gate circuit, which is constituted by connecting the base of the third transistor via two semiconductor junctions to each of the emitters of the input transistors, the quiescent current setting of the input transistors is varied with the input signal, so that the slew rate of the differential amplifier is increased for large input signals.

13 Claims, 3 Drawing Figures

DIFFERENTIAL AMPLIFIER

The invention relates to a differential amplifier which comprises a first and a second transistor of the same conductivity type, whose emitters are each connected to a common point via a resistor.

At high frequencies and with large signals, differential amplifiers are subject to a limitation which is determined by the so-called "Slew Rate." This is to be understood to means the maximum rate of change of the output signal. It is known, inter alia, from the article "IC Electronics Applied In Analog Circuit Blocks" by R.J. v.d. Plassche, published in "Journal of the Dutch Electronics and Radio Society", Volume 38, No. 2/3, 1973, pages 47–56, that said Slew Rate at constant bandwidth is determined by the ratio of the quiescent current and the slope of the transistors of the differential pair. In the case of a differential pair with a common emitter circuit the slope is proportional to the quiescent current setting, so that the Slew Rate is constant. Applying negative feedback to the differential pair by the inclusion of resistors in the emitter circuits ensures that the effective slope becomes less dependent on the quiescent current setting, so that increasing the quiescent current yields a higher slew rate. For comparatively small signals, however, an increase of the quiescent current means a substantial reduction of the signal-to-noise ratio, while moreover an increase of the quiescent current causes an increase of the temperature drift. The invention utilizes the insight that said problems can be mititgated by varying the quiescent current setting of the differential pair with the input signal.

Varying the quiescent current setting with the input signal is known in signal expansion circuits, as for example described in Austrian Patent Specification No. 174,421. To increase the slew-rate of differential amplifiers it is known, from U.S. Pat. No. 3,668,538, to couple the emitters of a pair of input transistors crosswise via the base-emitter paths of a pair of transistors of a conductivity type opposite to the conductivity type of the input transistors. The collector currents of these coupling transistors then provide the output signal of the differential amplifier. In practice, the use of transistors of an opposite conductivity type downgrades the high-frequency behaviour of the circuit arrangement.

In order to increase the slew rate of a differential pair, whose emitters are connected to a common point via a resistor means, the invention is characterized in that the emitters of said transistors are also mutually connected via at least two semiconductor junctions connected in series-opposition, a first current source supplying the bias currents for these semiconductor junctions, and that said common point is connected to the emitter of a third transistor whose base is coupled to the connecting line between said two semiconductor junctions, while the quiescent-current setting of the third transistor is determined by a second current source.

The invention will be described in more detail with reference to the accompanying drawings, in which
 FIG. 1 shows a first embodiment,
 FIG. 2 a second embodiment, and
 FIG. 3 a third embodiment of a differential amplifier according to the invention.

The amplifier of FIG. 1 comprises a pair of transistors T1 and T2, whose emitters, via the resistors 7 and 8 respectively, are connected to a common point 13. The collectors of the transistors T1 and T2 are connected to the output connection points 3 and 4 respectively and via the resistors 9 and 10 respectively to a terminal 6 of a supply source, in the present example the positive supply terminal. The bases 1 and 2 of the transistors T1 and T2 respectively constitute the input terminals, between which an input voltage can be applied, whereas the output voltage is available between points 3 and 4. The emitters of the transistors T1 and T2 are connected to the bases of the transistors T4 and T5 respectively, which are of a conductivity type which is opposite to that of the transistors T1 and T2. In the present example the transistors T4 and T5 are of the pnp conductivity type. The emitters of the transistors T4 and T5 are mutually connected and via a current source 12 to the positive supply terminal 6 so that, between the emitters of the transistors T1 and T2, two semiconductor junctions — constituted by the emitter-base junctions of the transistors T4 and T5 — are connected in series-opposition. The collectors of the transistors T4 and T5 are connected to a negative supply terminal 5. Moreover, the emitters of the transistors T4 and T5 are connected to the base of a transistor T3, which in the present example is of the npn conductivity type. The collector of T3, is connected to the positive supply terminal 6 and its emitter is connected to the common point 13 which, via a current source 11, is connected to the negative supply terminal 5.

In the absence of a voltage between the bases of the transistors T1 and T2, these transistors should conduct a comparatively small quiescent current. Moreover, a good symmetry is required, i.e. the quiescent currents of the transistors T1 and T2 should be equal. When the transistors T1 and T2 are identical and the base currents of the transistors T4 and T5 are equal, this means that the resistors 7 and 8 should be equal. The voltages across the resistors 7 and 8 are then equal, so that in the case of identical transistors T4 and T5 the current $I12$, which is supplied by the current source 12, is uniformly distributed between the transistors T4 and T5. In the absence of a differential signal at the bases of the transistors T1 and T2, the base-emitter voltage of transistor T3 equals the sum of the base-emitter voltage of transistor T4 and the voltage across the resistor 7 and also equals the sum of the base-emitter voltage of transistor T5 and the voltage across the resistor 8. Assuming that it is required to vary the collector currents of the input transistors by a maximum factor of 10, and that at full drive the current which then flows through the collector-emitter path of transistor T3 is negligible relative to the current $I11$ which is supplied by the current source 11, the quiescent current of the transistors T1 and T2 in the absence of an input signal should equal 0.1 $I11$, a current of 0.8 $I11$ flowing through the collector-emitter path of transistor T3. The currents 0.1 $I11$ then flow through the resistors 7 and 8. Taking into account the previously-mentioned equality of the base-emitter voltage of transistor T3 to the sum of the base-emitter voltage of transistor T4 and the voltage across the resistor 7, a suitable value for resistors 7 and 8 and for the current $I12$ can then be found.

When an input difference voltage is applied between the bases of the transistors T1 and T2 and said voltage increases, the voltage at the base of transistor T1 then becoming positive relative to the voltage at the base of transistor T2, the emitter current of transistor T1 will increase and the emitter current of transistor T2 will decrease, so that the voltage across the resistor 7 increases and the voltage across the resistor 8 decreases. As a result, the base-emitter voltage of transistor T4 decreases and the base-emitter voltage of transistor T5 increases. The current I12 is then gradually transferred to the transistor T5. Initially, this will have hardly any effect on the base-emitter voltage of transistor T3, so that the sum of the emitter currents of the input transistors T1 and T2 increases only slightly for small input signals. When an input difference voltage is attained such that transistor T4 is turned off, the current I12 will completely flow through the emitter-collector path of transistor T5, so that the base-emitter voltage of transistor T5 will no longer change. A further increase of the input difference voltage causes a reduction of the voltage across the resistor 8, which voltage decrease is now directly followed by the base-emitter voltage of transistor T3. The emitter current of transistor T3 then decreases, so that the part of the current I11 which flows to the differential pair increases. A maximum input difference voltage is attained when transistor T2 has assumed the non-conducting state. When the base current of transistor T5 is neglected, the voltage across the resistor 8 is 0 V at that instant and the base-emitter voltage of transistor T3 equals the base-emitter voltage of transistor T5. When the two transistors are identical, the current which then flows through the collector-emitter path of transistor T3 equals I12. As the difference between the base-emitter voltages of the transistors T1 and T2 at which transistor T2 is just turned off is comparatively small, the maximum input difference voltage is substantially determined by the product of the current I11 and the value of the resistors 7 and 8 respectively. The maximum output voltage excursion when the resistors 9 and 10 are equal is determined by the current I11 and the value of the resistors 9 and 10 respectively. When the voltage at the base of transistor T2 becomes positive relative to the voltage at the base of transistor T1, a similar operation will happen in a symmetrical manner.

Although the transistors T4 and T5 are pnp's, i.e. lateral transistors in the case of integration, the high frequency properties will not be worse owing to the grounded collectors of said transistors. Moreover, it is possible for the transistors T4 and T5 to take the form of vertical substrate pnp-transistors in integrated circuits.

Instead of connecting the collectors of the transistors T4 and T5 to the negative supply terminal, these transistors may also be connected to the respective bases of the transistors T4 and T5 so that they are connected as diodes.

Figure 2:
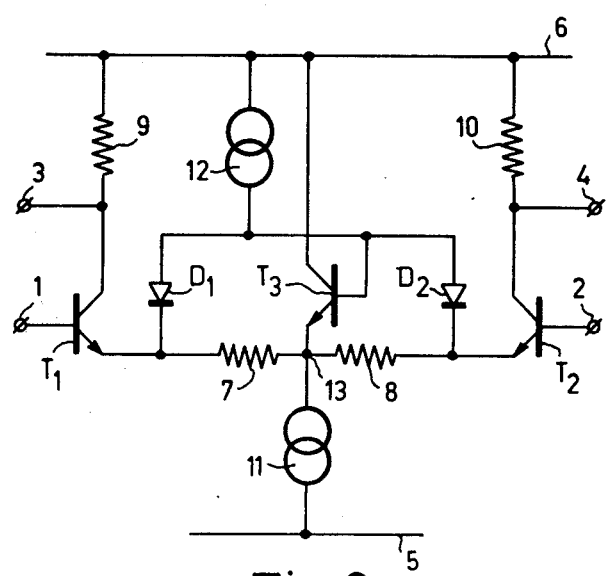

FIG. 2 shows an embodiment of a differential amplifier according to the invention in which the transistors T4 and T5 have been replaced by the diodes D1 and D2. Otherwise, the amplifier is identical to the amplifier of FIG. 1.

The operation of the amplifier of FIG. 2 is similar to the operation of the amplifier of FIG. 1, but allowance must be made for the currents which flow through the diodes D1 and D2. These currents also flow through the resistors 7 and 8 respectively. When the current I12 is small relative to the current I11, this has substantially no effect on the operation of the amplifier.

Instead of increasingly transferring the current which flows through the collection-emitter path of transistor T3 to the transistors of the differential pair, it is possible to replace transistor T3 by a transistor of the opposite conductivity type, through which the sum of the emitter currents of the transistors T1 and T2 flows.

Figure 3:
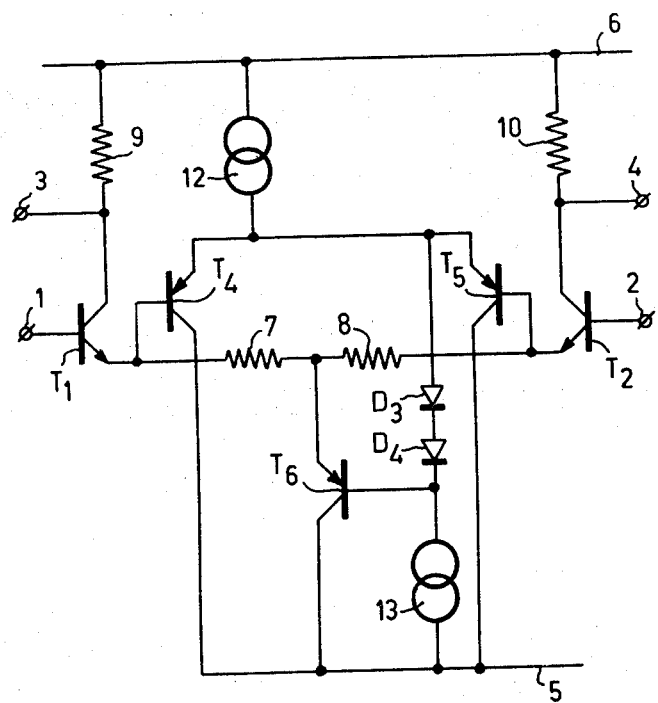

FIG. 3 shows an example of such an amplifier. The circuit arrangement is similar to the circuit arrangement of FIG. 1, the transistor T3 being replaced by a pnp transistor T6 whose collector is connected to the negative supply terminal 5 and whose base is connected to the emitters of the transistors T4 and T5 via the series connection of two diodes, which may be transistors connected as diodes. The current source 11 is replaced by a current source 13 which connects the base of transistor T6 to the negative supply terminal 5.

In the absence of an input difference voltage and in the case of a satisfactory symmetry of the amplifier, the difference of the current I12 and the current which flows through the diodes D3 and D4, is uniformly distributed between the collector-emitter paths of the transistors T4 and T5. The difference between the voltage across the series-conmection of the diodes D3 and D4 and the base-emitter voltage of transistor T6 equals the sum of the base-emitter voltage of transistor T5 and the voltage across the resistor 8. When, as in the amplifier of FIG. 1, it is for example required that the collector current of the transistors T1 and T2 be capable of varying by a factor of 10, the base current of transistor T6 should be capable of varying by a factor of 5. This means that the current I13, which is supplied by the current source 13, should at a minimum be five times that of the base current of transistor T6 at the desired quiescent current of the transistors T1 and T2 in the absence of an input difference voltage. On the basis of this data the values of the resistors 7 and 8 and the current sources 12 and 13 can be determined.

When the voltage at the base of transistor T1 gradually increases relative to the voltage at the base of transistor T2, transistor T5 will become more conductive and transistor T4 will become less conductive, as in the amplifier of FIG. 1, without initially appreciably affecting the setting of transistor T6. When transistor T4 assumes the non-conducting state, the emitter voltage of transistor T5 will completely follow the decreasing voltage at the base of transistor T2, so that the base-emitter voltage of transistor T6 increases, and the voltage across the diodes D3 and D4 decreases. An increasing part of the current I13 is then drawn from the base of transistor T6 and the emitter current of transistor T6 increases.

As in the amplifier of FIG. 1, the transistors T4 and T5 may be replaced by diodes.

The invention is not limited to the embodiments shown. Several modifications are possible, including the use of different types of transistors. Moreover, the circuit arrangement may take the form of a monolithic integrated circuit.

What is claimed is:

1. A differential amplifier comprising a first transistor and a second transistor of the same conductivity type, means connecting the emitters of said first and second transistors to a common point via first and second resistors, respectively, means connecting the emitters of said transistors together via at least two semiconductor junctions connected in series opposition so as to form a second common point between the two semiconductor junctions, a first current source coupled to said second common point for supplying the bias currents for said semiconductor junctions, a third transistor having its base coupled to said second common point and its emitter connected to the first common point, and a second current source coupled to the third transistor for controlling the quiescent current setting of the third transistor.

2. A differential amplifier as claimed in claim 1, wherein said semiconductor junctions comprise the base-emitter junctions of fourth and fifth transistors of a conductivity type opposite to the conductivity type of the first and second transistors, means connecting the emitters of the fourth and fifth transistors to the second common point, and means connecting the bases of the fourth and fifth transistors to the emitters of the first and second transistors, respectively.

3. A differential amplifier as claimed in claim 1 wherein the third transistor is of the same conductivity type as the first and second transistors, the emitter of the third transistor being connected to said second current source and the base being connected directly to said second common point between the two semiconductor junctions and thereby being connected to the first current source.

4. A differential amplifier as claimed in claim 1 wherein the third transistor is of a conductivity type opposite to the conductivity type of the first and second transistors, the base of the third transistor being connected to said second current source and to said second common point via the series connection of a third and a fourth semiconductor junction whereby the second current source supplies base current for the third transistor.

5. A differential amplifier as claimed in claim 1 wherein the third transistor is of the same conductivity type as the first and second transistors and the second current source supplies current to the emitter of the third transistor.

6. A differential amplifier comprising first and second transistors of the same conductivity type, resistor means connecting the emitters of each of said transistors to a first common junction point, input means for applying an input signal to the base of at least one of said first and second transistors, first and second semiconductor junctions connected in series opposition between the emitters of said first and second transistors with a second common junction formed between the two semiconductor junctions, a first current source coupled to said second common junction for applying current to said semiconductor junctions, a third transistor with its emitter coupled to the first common junction, a second current source coupled to the third transistor so as to determine the quiescent current setting of the third transistor, and means for coupling the base of the third transistor to the second common junction so that the quiescent current setting of the first and second transistors varies as a function of the input signal.

7. A differential amplifier as claimed in claim 6 wherein said first and second semiconductor junctions comprise the base-emitter junctions respectively of fourth and fifth transistors of opposite conductivity type to that of the first and second transistors, the emitters of the fourth and fifth transistors being connected together to form said second common junction and the bases of the fourth and fifth transistors being connected to the emitters of the first and second transistors, respectively.

8. A differential amplifier as claimed in claim 6 wherein the third transistor is of the same conductivity type as the first and second transistors and the second current source supplies current to the emitter of the third transistor.

9. A differential amplifier as claimed in claim 8 wherein said resistor means comprises first and second resistors connected between the emitters of the first and second transistors and the first common junction, respectively, and wherein the emitter of the third transistor is connected to the second current source and the third transistor base electrode is connected directly to the second common junction.

10. A differential amplifier as claimed in claim 6 wherein the third transistor is of a conductivity type opposite to that of the first and second transistors, the base of the third transistor being connected to the second common junction via a forwardly biased third semiconductor junction and also being connected to the second current source whereby the second current source provides base current for said third transistor.

11. A differential amplifier as claimed in claim 10 wherein said resistor means comprise first and second resistors connected between the emitters of the first and second transistors and the first common junction, respectively, and wherein the emitter of the third transistor is connected to the first common junction.

12. A differential amplifier as claimed in claim 11 wherein said first and second semiconductor junctions comprise the base-emitter junctions respectively of fourth and fifth transistors of opposite conductivity type to that of the first and second transistors, the emitters of the fourth and fifth transistors being connected together to form said second common junction and the bases of the fourth and fifth transistors being connected to the emitters of the first and second transistors, respectively.

13. A differential amplifier as claimed in claim 6 wherein said resistor means comprises first and second resistors connected between the emitters of the first and second transistors and the first common junction, respectively, and wherein the emitter of the third transistor and one terminal of the second current source are each connected to said first common junction.

* * * * *